US006340912B1

(12) United States Patent
Gerstenberg et al.

(10) Patent No.: US 6,340,912 B1
(45) Date of Patent: Jan. 22, 2002

(54) SOLID STATE MAGNETRON SWITCHER

(75) Inventors: John W. Gerstenberg, Lake Elsinore; Hung P. Van, Fullerton, both of CA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/540,723

(22) Filed: Mar. 31, 2000

Related U.S. Application Data

(63) Continuation-in-part of application No. 09/109,680, filed on Jul. 2, 1998, now abandoned.

(51) Int. Cl.[7] .............................................. H03K 17/54

(52) U.S. Cl. ...................... 327/506; 327/418; 327/427; 327/307; 327/126

(58) Field of Search ................................ 327/419, 418, 327/427, 478, 506, 378; 307/126

(56) References Cited

U.S. PATENT DOCUMENTS

| | | | | |
|---|---|---|---|---|
| 2,440,049 A | | 4/1948 | Houghton | 327/506 |
| 2,535,912 A | | 12/1950 | Frank et al. | 327/506 |
| 3,995,133 A | | 11/1976 | Anderson | 219/715 |
| 4,005,370 A | | 1/1977 | Kusunoki et al. | 327/531 |
| 4,017,702 A | | 4/1977 | Harmon et al. | 219/715 |
| 4,281,372 A | * | 7/1981 | Kornrumpf | 363/20 |
| 5,321,235 A | * | 6/1994 | Makino et al. | 363/21 |
| 5,928,552 A | | 7/1999 | Lee | 219/21 |

* cited by examiner

*Primary Examiner*—Terry D. Cunningham
(74) *Attorney, Agent, or Firm*—David W. Collins; Colin M. Raufer; Glenn H. Lenzen, Jr.

(57) ABSTRACT

Switching apparatus for switching on and off one or more microwave tubes. A preferred embodiment of the switching apparatus comprises a solid state magnetron switcher that switches a plurality of magnetrons on and off using a plurality of high voltage (IGBT) switches. The microwave tubes or magnetrons are driven from a single power supply. The technical approach employed in the present invention places all microwave tubes or magnetrons into low level oscillation prior to switching them into full conduction. This maintains minimal voltage across the high voltage switches while allowing only a small percentage (1–2%) of full load current to be drawn.

26 Claims, 4 Drawing Sheets

SOLID STATE MAGNETRON SWITCHER

This Application is a C-I-P of Ser. No. 09/109,608 filed Jul. 2, 1998, abandoned.

BACKGROUND

The present invention relates generally to magnetron devices, and more particularly, to a solid state magnetron switcher employing insulated gate bipolar junction transistors for switching high voltage pulses among multiple magnetrons.

The prior art approach to switching high voltage pulses among multiple magnetrons is disclosed in U.S. patent application Ser. No. 08/652,889, filed May 23, 1996, entitled "Thyratron Switched Beam Steering Array", assigned to the assignee of the present invention. The approach disclosed in this patent application provides for a reasonably fast switching scheme with relatively small compactness. However, this approach cannot be directly commanded OFF and relies on a power supply pulse to be discontinued. This approach requires and generates hundreds of watts of heat. It was found that noise emissions using this approach were relatively high and the effects were difficult to deal with.

Prior art switching devices such as those disclosed in the above-cited patent application, have utilized thyratrons as switches instead of IGBT devices. Thyratrons require extensive filament and reservoir power which produces high temperature heat loads. Thyratrons emit a large amount of plasma noise when switched which can adversely affect operation of the magnetrons. Also, these devices cannot be commanded Off and must rely on the power supply high voltage pulse to be discontinued.

Therefore, it would be an advantage to rapidly switch several microwave tubes On and Off while driven from a single high voltage power supply. Accordingly, it is an objective of the present invention to provide for an improved solid state magnetron switcher for switching high voltage pulses among multiple magnetrons.

SUMMARY OF THE INVENTION

To accomplish the above and other objectives, the present invention provides for a solid state magnetron switcher that switches high voltage pulses among multiple magnetrons. The present invention switches high voltage to multiple magnetrons thereby gating them ON and OFF. The present invention provides for a small, light-weight, efficient, and fast switching mechanism that offers both ON and OFF control.

More particularly, the solid state magnetron switcher comprises a plurality of magnetrons, one insulated gate bipolar junction transistor (IGBT) high voltage switch coupled to each magnetron, a trigger circuit coupled to each IGBT high voltage switch, an isolation transformer coupled to the trigger circuit, and a floating resistor coupled across each of the IGBT high voltage switches.

The present invention provides a versatile solution to drive multiple magnetrons with a single high voltage pulse power supply. For a system requiring the use of an incoherent RF source, such as a magnetron, this solution is ideal for meeting the stringent objectives of rapidly switching a microwave tube on and off several times a second with long millisecond RF pulse characteristics. Presently, no other approach exists that provides command OFF ability and high current and large pulse width capabilities when driven by a single high voltage power supply.

The first advantage of the present invention over the prior art approach is that the high voltage power supply does not need to be turned off in order to extinguish each magnetron pulse. The IGBT devices are ON/OFF controllable devices.

The second advantage of the present invention is that IGBT devices require minimal drive power to operate on the order of milliwatts, whereas the prior art approach requires hundreds of watts which produces excess heat. The low power consumption here will allow a much smaller and lighter high voltage isolation transformer to be used.

The third advantage of the present invention is that the IGBT devices can be switched on prior to the high voltage power supply, which offers a smoother voltage rise time on the magnetron instead of the voltage pedestal effect normally encountered when the magnetron goes from low to high level oscillation. The low level oscillation refers to a level at which the magnetron draws a minimal amount of current but maintains itself in a conduction mode. This allows the magnetron to be less sensitive to the pedestal voltage rise time used to place the magnetron at its full power operation. Also, by switching prior to the high voltage pulse, the switching losses in the IGBT device are greatly reduced.

The present invention may be advantageously used with one or more magnetron devices having high PRF. The principles of the present invention may be used in instances where magnetrons must have small size and weight.

The solid state magnetron switcher of the present invention offers command OFF capability, requires only milliwatts of drive power, and is very efficient. Furthermore, the solid state magnetron switcher of the present invention is also smaller and lighter than the prior art devices.

A key aspect of the present invention is to place each magnetron into low level oscillation by using the correct value of resistance between the high voltage power supply and the magnetrons. This minimizes the voltage across each IGBT device.

The IGBT switches can be switched between magnetrons at a maximum rate of several KHz (i.e., 10–20 KHz) limited by pulse width, number of magnetrons, average power available, and switching speed of the IGBT devices. Interpulse switching times between array elements primarily depend on the limitations of the high voltage power supply. The technological approach of the present invention offers fast ON and OFF pulse commands with large pulse widths (i.e., microseconds—seconds) typically around several milliseconds.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
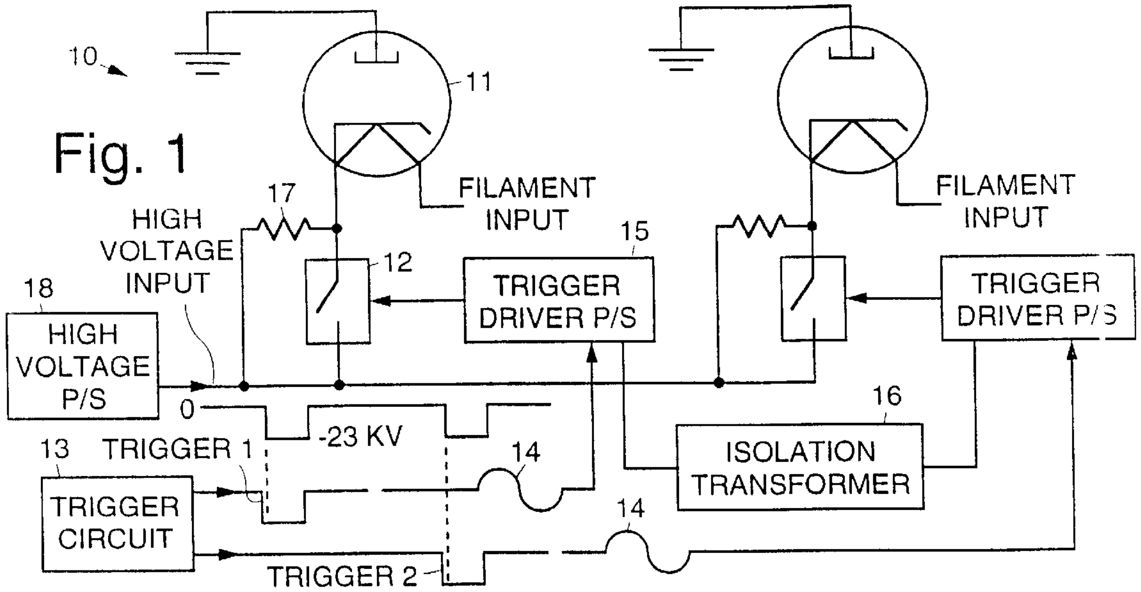
FIG. 1 illustrates an exemplary solid state magnetron switcher in accordance with the principles of the present invention implemented using two magnetrons.
Figure 1A:
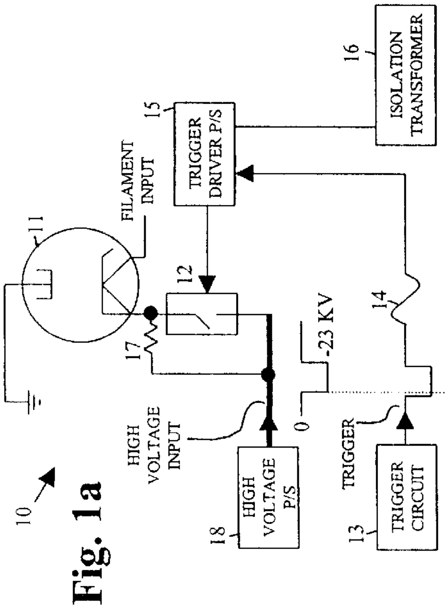
FIG. 1*a* illustrates the switcher of FIG. 1, but using one magnetron.
Figure 1B:
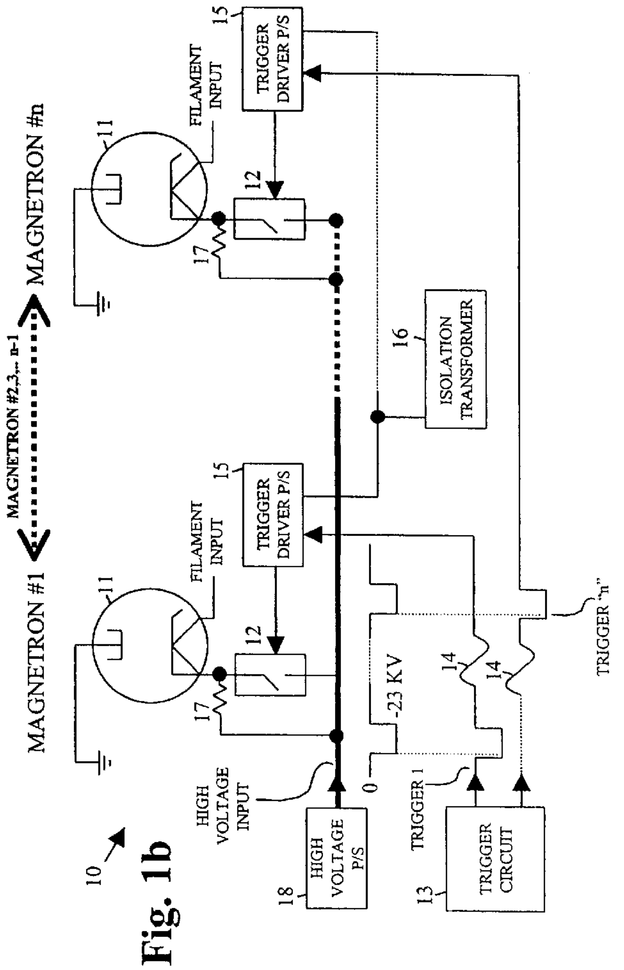
FIG. 1*b* illustrates the switcher of FIG. 1, but using a plurality of magnetrons.

Referring to the drawing figures, wherein the same numerals refer to the same elements throughout, FIG. 1 illustrates an exemplary solid state magnetron switcher 10 in accordance with the principles of the present invention. FIG. 1 shows the solid state magnetron switcher 10 used to switch two magnetrons 11. However, it is to be understood that any number of magnetrons 11 may be switched using the present invention, as depicted in FIG. 1*b,* and that the disclosed embodiment is not to be taken as limiting the scope of the present invention. Further, a single magnetron 11 may alternatively be switched, as depicted in FIG. 1*a*.

With reference to FIG. 1, the solid state magnetron switcher 10 comprises a plurality of magnetrons 11, one insulated gate bipolar junction transistor (IGBT) high voltage switch 12 coupled to each magnetron 11, a trigger circuit 13, which includes a trigger driver power supply 15, coupled to each IGBT high voltage switch 12, a common high voltage power supply (P/S) 18 coupled to each IGBT high voltage switch 12, a common isolation transformer 16 coupled to the trigger circuit 13, and a floating resistor 17 coupled across each of the IGBT high voltage switches 12. The floating resistor 17 thus "rides" at a high voltage and is not at ground potential. Fiber optic cables 14 are used to interconnect the trigger circuit 13 to the trigger driver power supply 15 for each IGBT high voltage switch 12.

The solid state magnetron switcher 10 of the present invention operates to switch high voltage to multiple magnetrons 11 thereby gating them ON and OFF. The solid state magnetron switcher 10 is a small, lightweight, efficient, and fast switching mechanism that offers OFF control as well as ON control. Hence, the ability to rapidly switch several microwave tubes (i.e., the magnetrons 11) ON and OFF which are driven from a single high voltage power supply 18 is provided by the present invention.

A key aspect of the technical approach employed in the present invention is to place all magnetrons 11 into low level oscillation prior to switching them into full conduction. This maintains minimal voltage across the IGBT switches 12 while allowing only a small percentage of full load current to be drawn (i.e., 1–2%). The gains compared with the conventional thyratron approach used in the prior art will become evident in the following discussion.

One advantage over the prior art approach is that the high voltage power supply 18 does not need to be turned off in order to extinguish each magnetron pulse. The IGBT switches 12 are ON/OFF controllable, or triggerable, devices.

Another advantage is that IGBT switches 12 require minimal drive power to operate on the order of milliwatts, whereas the prior art approach requires hundreds of watts, which produces excess heat. The low power consumption of the present invention allows a much smaller and lighter high voltage isolation transformer 16 to be used. The IGBT switches 12 can also be driven using trigger driver power supplies 15 comprising batteries 15 (without the need for the isolation transformer 16) to provide for isolated power since the power consumption is minimal. This allows for increased isolation during magnetron arcs.

Another advantage is that the IGBT switches 12 can be switched on prior to the high voltage power supply 18 which offers a smoother voltage rise time on the magnetrons 11 instead of the voltage pedestal affect that normally occurs when the magnetron 11 goes from low to high level oscillation. This allows each magnetron 11 to be less sensitive to pedestal voltage rise time used to place it at its full power operation. Also, by switching prior to the high voltage pulse, switching losses in the IGBT switches 12 are greatly reduced.

There are several switching approaches that may be implemented to switch between magnetrons 11. Two general approaches are discussed below. The general circuit layout of the magnetron switch 10 is shown in FIG. 1. The resistance value of the resistor 17 is chosen that allows each magnetron 11 to draw only a minimal amount of current. This provides for a low power drop across the resistor 17 and minimizes the voltage drop across the resistor 17 and the IGBT switch 12. Keeping the voltage across the IGBT switches 12 to less than 1 kV is a key aspect of the present invention. Since this voltage is maintained at 1 kV or less, small low voltage power resistors may be used instead of large high voltage resistors, thereby providing for a more compact circuit.

More than one IGBT switch 12 can be connected in series to hold off more voltage than one 1 kV. However, it becomes difficult to simultaneously switch the switches 12 and have matched dynamic impedances for each of the switches 12. The voltage across the IGBT switches 12 must be shared equally to insure reliable operation. An alternative is the use of a few switches 12 to share the 1 kV overall voltage (i.e., 500 volts per switch 12 if two IGBT switches 12 are implemented. The voltage must be maintained within its voltage specification. The magnetrons 11 that work at these large millisecond pulse widths generally operate at no more than tens of amps, which is well within the 1200 amp limit. The IGBT switch 12 was selected due to its triggerable ON/OFF, high voltage, and high current characteristics. Other switching devices, such as field effect transistors (FETs), for example, may be used but are considered less robust. However, FETs are limited by their current handling capacity, and thus parallel/series combinations of FETs would be required.

Figure 2:
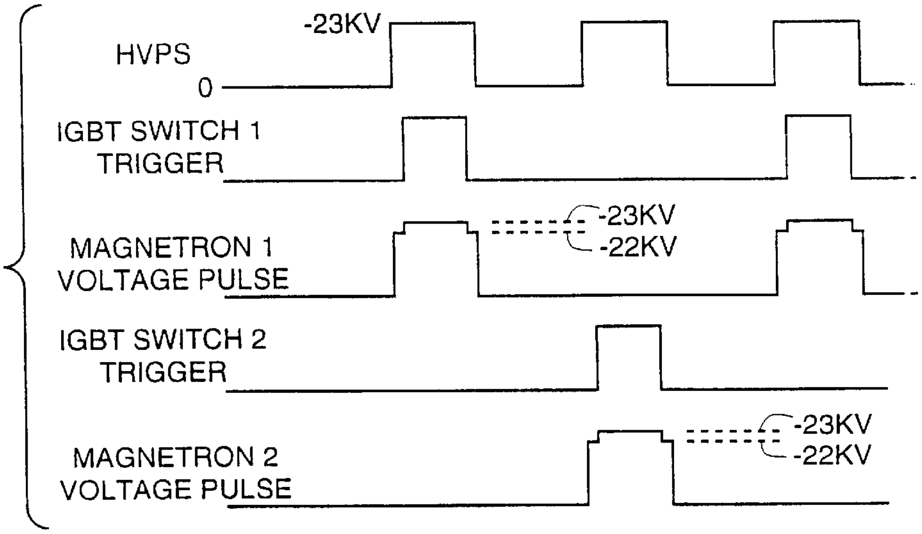
FIG. 2 illustrates post-trigger IGBT timing that may be used in the switcher of FIG. 1.

The first switching approach or technique is to turn the high voltage power supply 18 ON, either pulsed or continuously (CW), prior to switching the IGBT switch 12. This approach lends itself to higher pulse repetition frequency (PRF) waveforms where high voltage power supply rise time and instabilities are a concern. FIG. 2 illustrates this timing approach. Two magnetrons 11 triggered sequentially are assumed for this diagram. Voltages and currents shown are for illustration purposes only and are not design requirements.

Figure 3:
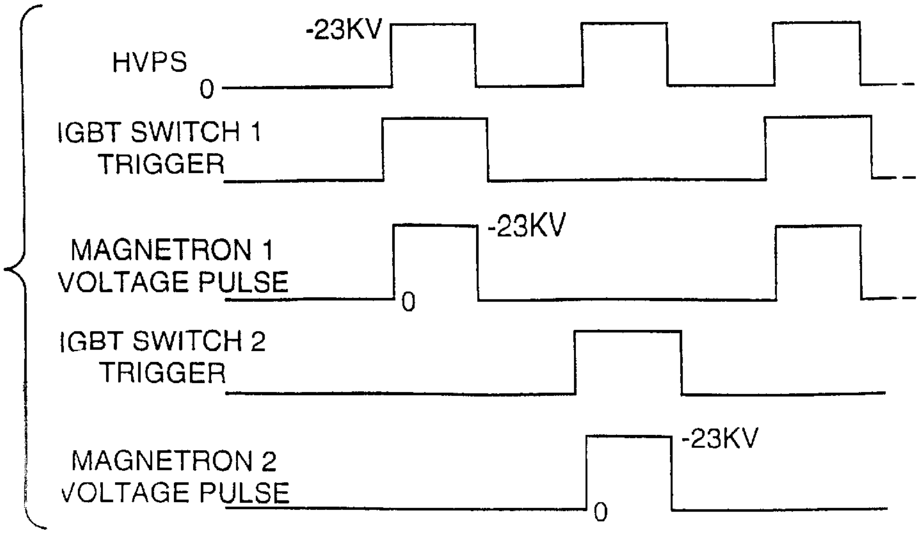
FIG. 3 illustrates pre-trigger IGBT timing that may be used in the switcher of FIG. 1.

The second approach or technique is to switch the IGBT switch 12 prior to pulsing or turning the high voltage power supply 18 on. This approach minimizes the total time for which the IGBT switch 12 must hold off high voltage and therefore increases its reliability. This feature allows the engaged magnetron 11 to rise from zero oscillation to full conduction smoothly and without the pedestal voltage and its instantaneous current loading of the high voltage power supply 19 (e.g., 100 ma to 13 amps) when switched. FIG. 3 illustrates this timing approach. Two magnetrons 11 triggered sequentially are assumed for the timing diagram of FIG. 3.

In the examples shown in FIGS. 2 and 3, the low level oscillation draws enough current to develop up to a 1 kV voltage drop across a network that includes the IGBT switch 12 and the resistor 17. This is an example voltage drop, and other magnetron tubes may require higher (2 kV, for example) voltages which would require multiple series IGBT switches 12 driven in parallel, for example. This becomes an optimization tradeoff between the power dissipated by the resistor 17 verses voltage held off by the IGBT switch 12. Other limitations imposed by the design such as total current available from the high voltage power supply 18 and low level tube radiation may influence the design. It is to be understood that the use of 1 kV magnetrons 11 is not to be taken as limiting the present invention.

The resistor 17 has two basic functions. One function is to place the magnetron 11 into oscillation so that when the additional voltage (i.e., 1 kV) is applied, the rise time is not an issue. The resistor 17 drops enough voltage so that the magnetron 11 only oscillates at about 1–2% of full power level. The other function preformed by the resistor 17 is that the voltage across the IGBT switches 12 that hold-off voltage to the other magnetrons 11 that are not currently pulsed will not exceed 1 kV. Otherwise, as in the examples above, the switches 12 would have to hold off the full voltage, here 23 kV, and therefore could not be used.

In this design, the IGBT switches 12 simply rise and float at high voltage. This requires a simple high voltage isolation transformer 16 to provide trigger power to the switch 12. As mentioned previously, this power is minimal and can be triggered using fiber optic cables 14*s* and a pulse generator (implemented in the trigger circuit 13), for example.

Figure 4:
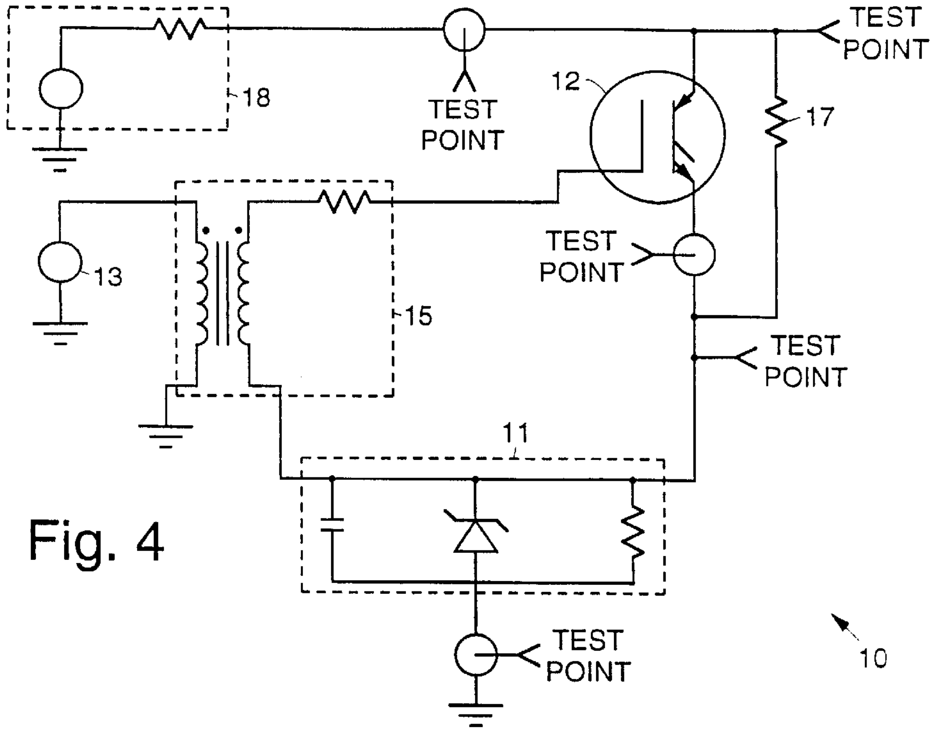
FIG. 4 illustrates a detailed circuit diagram of the present solid state magnetron switcher.
Figure 5:
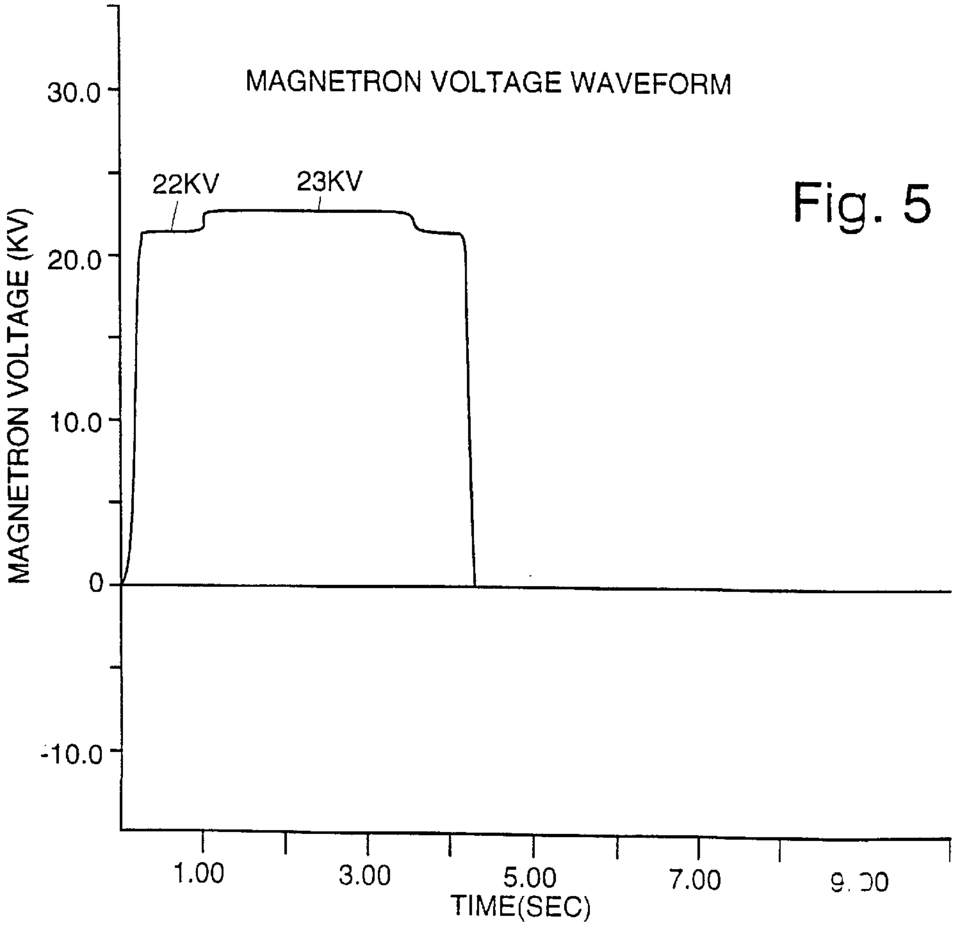
FIG. 5 is a graph illustrating magnetron voltage versus time using the present solid state magnetron switcher.
Figure 6:
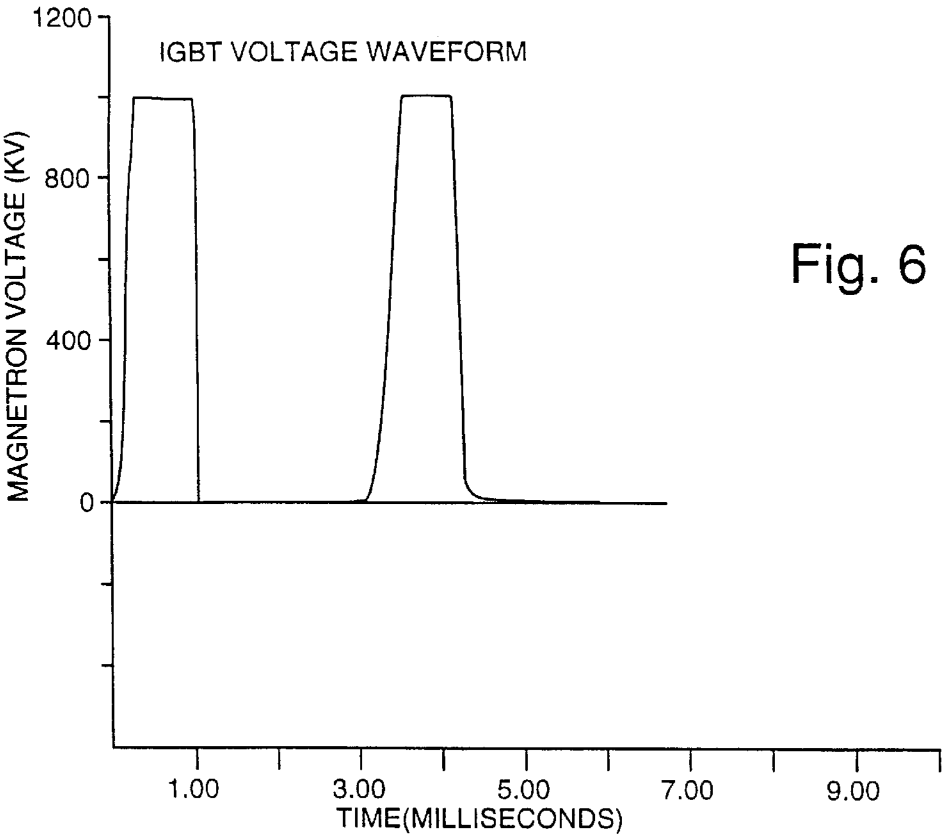
FIG. 6 is a graph illustrating IGBT voltage versus time using the present solid state magnetron switcher.
Figure 7:
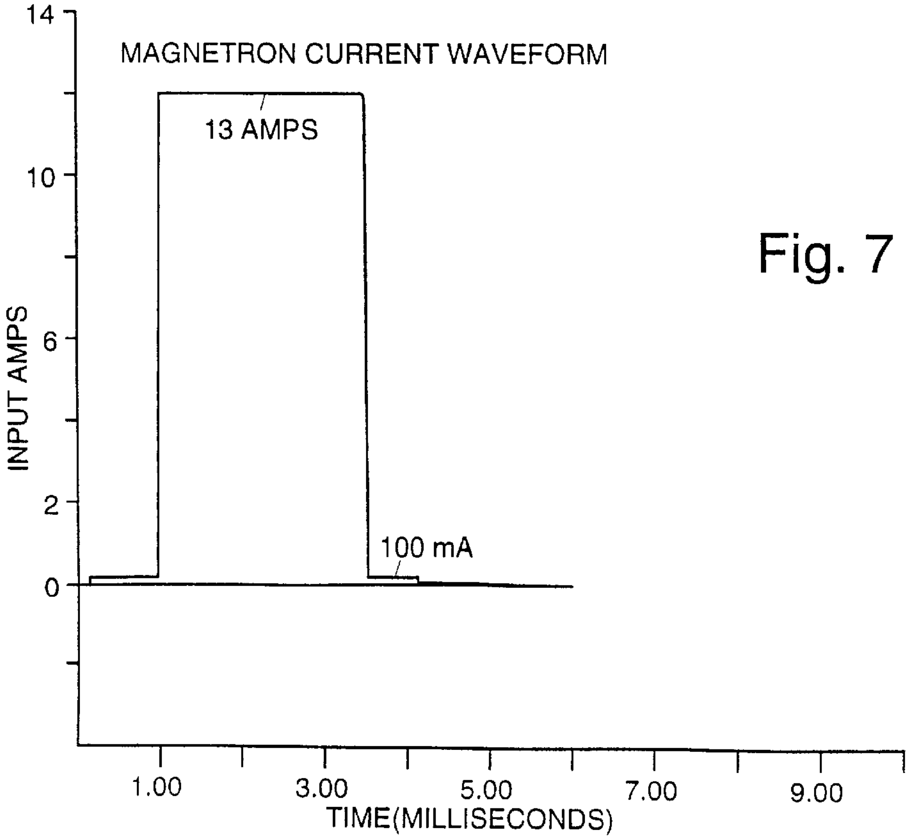
FIG. 7 is a graph illustrating magnetron current versus time using the present solid state magnetron switcher.

An exemplary modeling circuit corresponding to the solid state magnetron switcher 10 is shown in FIG. 4. FIG. 4 depicts a single magnetron 11 and its switching logic comprising the switcher 10. The modeling circuit of FIG. 4 is basic and does not require modeling of the isolation transformer 16 or the fiber optic cables 14 shown in FIG. 1. FIG. 5 is a graph showing the voltage on a magnetron 11 when triggered as shown in FIG. 2 (post-trigger). FIG. 6 is a graph showing the voltage across the IGBT switch 12 of FIG. 4. To increase reliability, the IGBT switch 12 can be triggered as shown in FIG. 3 (pre-trigger) prior to the high voltage and therefore need only hold off voltage when other magnetrons 11 are pulsed. In a pre-triggered situation, the double pulse shown in FIG. 6 would not exist. Only a constant voltage pulse will result when other switches 12 are triggered. FIG. 7 shows the current waveform of the magnetron 11 of FIG. 4 when it is driven using the solid state magnetron switcher 10.

The IGBT switching approach implemented in the solid state magnetron switcher 10 is small in size, light in weight, is highly efficient, has fast switching speed, has ON/OFF capability, and uses long RF pulse widths (>10's of milliseconds). Although this solution applies to magnetrons 11 specifically, since there is no modulating anode or grid as with other types of RF/microwave tubes, the present invention may be adapted to other tubes if appropriate.

The principle of operation of the magnetron switcher 10 is as follows. The preferred implementation of the magnetron switcher 10 uses continuous repetitive pulsing, although more complex waveforms may be used. In this case, each channel is sequentially triggered using the trigger source 13 and fiber optic cables 14 which then trigger the gates of the IGBT switches 12 and enable conduction. The voltage drop across the resistor 17 essentially goes to zero and therefore applies an additional 1 kV to the magnetron 11.

Since magnetrons 11 change current demand rapidly with small changes in voltage (once in the oscillation region), this results in full power oscillation. Consequently, changing the voltage from −22 kV to −23 kV will increase the current draw from 100 ma (low level oscillation) to 13A (full power).

The design of the magnetron switcher 10 allows a single high voltage power supply 18 to be used and thereby reduce overall system size and weight. High voltage pulses are present on cathodes of all magnetrons 11 simultaneously through the resistors 17 but are connected directly to only one magnetron 11 at any particular time by the triggered IGBT switch 12.

Triggering of the IGBT switch 12 before the high voltage power supply 18 reduces switching losses, provide a more gradual current demand on the power supply 18, and provide a smooth voltage rise to the magnetrons 11.

The magnetron switcher 10 may include various protection devices such as pulse spark gaps, varistors, and snubbers. The spark gaps can be specified with a higher breakdown than the operating voltage but lower than the maximum rating of the IGBT switch 12. This helps protect the IGBT switch 12 during magnetron arcs. It is believed that the rating of the IGBT switch 12 is sufficient to handle momentary arc currents that typically exist for less than a microsecond. Other protection devices may be implemented to insure reliability. These devices are not shown across the IGBT switch 12 so as not to confuse the drawing.

The solid state magnetron switcher 10 of the present invention provides the smallest and lightest design approach available with currently available technology. Design parameters for the solid state magnetron switcher 10 are as shown in Table 1.

TABLE 1

| | |
|---|---|
| Peak IGBT switch voltage | 1.4 kV |
| Switching time | 2 microseconds |
| Peak switching current | 1200 Amps |
| Multiple switching elements | No Limit, waveform dependent |
| Trigger pulse | On and Off command capable |
| PRF (pulse repetition freq.) | <20 KHz |
| Typical pulse width range | 100 μs–100 ms |
| Duty cycle | 50% typical, limited to IGBT heating < 5 kW |

Thus, the present invention provides for a magnetron switcher 10 that rapidly switches between multiple magnetrons 11 with ON/OFF capability while minimizing the volume and weight of the circuit. This design provides the most versatile solution for driving multiple magnetrons 11 with a single high voltage pulse power supply 18. For a system using an incoherent RF source such as a magnetron 11, this solution is ideal for meeting the stringent objectives of rapidly switching magnetrons 11, or other microwave tubes, on and off several times a second with long millisecond RF pulse characteristics. Presently, no other approach exists with command OFF ability as well as high current and large pulse width capabilities when driven by a single high voltage power supply 18. Further, many magnetron tubes can be operated simultaneously, and specific ones can be selected for operation.

Thus, improved solid state switching apparatus for switching high voltage pulses among multiple microwave tubes or magnetrons has been disclosed. It is to be understood that the described embodiment is merely illustrative of some of the many specific embodiments that represent applications of the principles of the present invention.

Clearly, numerous and other arrangements can be readily devised by those skilled in the art without departing from the scope of the invention.

What is claimed is:

1. Solid state switching apparatus comprising:

at least two microwave tubes;

a respective high voltage switch directly connected to each microwave tube for gating that microwave tube ON and OFF, independent of other microwave tubes;

a respective trigger circuit connected to each said switch for triggering each high voltage switch ON and OFF;

a common high voltage power supply connected to each switch for providing trigger power to each switch; and a respective floating resistor connected across each of said switches and not connected to ground for placing each microwave tube into oscillation so that when additional voltage is applied, rise time is not an issue and for preventing voltage across the high voltage switch from exceeding the additional voltage.

2. The apparatus of claim 1 further comprising a common isolation transformer coupled between each said trigger circuit.

3. The apparatus of claim 1 wherein said microwave tubes comprise magnetrons.

4. The apparatus of claim 1 wherein said trigger circuit comprises a pulse generator coupled by way of fiber optic cables to a plurality of trigger driver power supplies respectively connected to each of said switches.

5. The apparatus of claim 1 wherein each of said high voltage switches comprise an insulated gate bipolar junction transistor (IGBT) high voltage switch.

6. The apparatus of claim 1 wherein each of said high voltage switches comprise field effect transistor (FET) switch.

7. The apparatus of claim 1 wherein said trigger circuit comprises a pulse generator coupled by way of fiber optic cables to a plurality of batteries respectively connected to each of said switches.

8. Solid state switching apparatus comprising:

a microwave tube;

a high voltage switch directly connected to the microwave tube for gating the microwave tube ON and OFF;

a trigger circuit connected to the switch for triggering the high voltage switch ON and OFF;

a high voltage power supply connected to the switch for providing trigger power to the switch; and a floating resistor connected across the switch and not connected to ground for placing the microwave tube into oscillation so that when additional voltage is applied, rise time is not an issue and for preventing voltage across the high voltage switch from exceeding the additional voltage.

9. The apparatus of claim 8 further comprising an isolation transformer coupled to said trigger circuit.

10. The apparatus of claim 8 wherein said microwave tube comprises a magnetron.

11. The apparatus of claim 8 wherein said trigger circuit comprises a pulse generator coupled by way of a fiber optic cable to a trigger driver power supply connected to said switch.

12. The apparatus of claim 8 wherein said high voltage switch comprises an insulated gate bipolar junction transistor (IGBT) high voltage switch.

13. The apparatus of claim 8 wherein said high voltage switch comprises a field effect transistor (FET) switch.

14. The apparatus of claim 8 wherein said trigger circuit comprises a pulse generator coupled by way of a fiber optic cable to a battery connected to said switch.

15. Solid state switching apparatus comprising:

a plurality of microwave tubes;

a respective high voltage switch directly connected to each microwave tube for gating that microwave tube ON and OFF, independent of other microwave tubes;

a respective trigger circuit connected to each switch for triggering each high voltage switch ON and OFF, wherein the trigger circuit comprises a pulse generator coupled by way of fiber optic cables to a plurality of trigger driver power supplies respectively connected to each of the switches;

a common high voltage power supply connected to each switch for providing trigger power to each switch; and a respective floating resistor connected across each of the switches and not connected to ground for placing the microwave tube into oscillation so that when additional voltage is applied, rise time is not an issue and for preventing voltage across the high voltage switch from exceeding the additional voltage.

16. The apparatus of claim 15 further comprising a common isolation transformer coupled to the trigger circuit.

17. The apparatus of claim 15 wherein the microwave tubes comprise magnetrons.

18. The apparatus of claim 15 wherein each of the high voltage switches comprise an insulated gate bipolar junction transistor (IGBT) high voltage switch.

19. The apparatus of claim 15 wherein each of the high voltage switches comprise field effect transistor (FET) switch.

20. The apparatus of claim 15 wherein the trigger circuit comprises a pulse generator coupled by way of fiber optic cables to a plurality of batteries respectively connected to each of the switches.

21. Solid state switching apparatus comprising:

a microwave tube;

a high voltage switch directly connected to the microwave tube for gating the microwave tube ON and OFF;

a trigger circuit connected to the switch for triggering the high voltage switch ON and OFF, wherein the trigger circuit comprises a pulse generator coupled by way of a fiber optic cable to a trigger driver power supply connected to the switch;

a high voltage power supply connected to the switch for providing trigger power to the switch;

a common isolation transformer connected to the trigger circuit; and a floating resistor connected across the switch and not connected to ground for placing the microwave tube into oscillation so that when additional voltage is applied, rise time is not an issue and for preventing voltage across the high voltage switch from exceeding the additional voltage.

22. The apparatus of claim 21 further comprising a common isolation transformer coupled to the trigger circuit.

23. The apparatus of claim 21 wherein the microwave tube comprises a magnetron.

24. The apparatus of claim 21 wherein the high voltage switch comprises an insulated gate bipolar junction transistor (IGBT) high voltage switch.

25. The apparatus of claim 21 wherein the high voltage switch comprises a field effect transistor (FET) switch.

26. The apparatus of claim 21 wherein the trigger circuit comprises a pulse generator coupled by way of a fiber optic cable to a battery connected to the switch.

* * * * *